United States Patent [19]
Huang

[11] Patent Number: 5,940,603
[45] Date of Patent: *Aug. 17, 1999

[54] METHOD AND APPARATUS FOR EMULATING MULTI-PORTED MEMORY CIRCUITS

[75] Inventor: Thomas B. Huang, San Jose, Calif.

[73] Assignee: Quickturn Design Systems, Inc., Mountainview, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/953,315

[22] Filed: Oct. 17, 1997

Related U.S. Application Data

[63] Continuation of application No. 08/617,977, Mar. 15, 1996, abandoned, which is a continuation of application No. 08/310,202, Sep. 21, 1994, abandoned, which is a continuation of application No. 08/082,051, Jun. 24, 1993, abandoned.

[51] Int. Cl.[6] ....................................... G06F 3/00
[52] U.S. Cl. .......................... 395/500; 364/578; 364/488; 365/189.04
[58] Field of Search ................... 395/500, 180; 364/578, 488; 371/22.1, 22.2, 27.4; 326/41; 365/189.04, 230.03, 230.05

[56] References Cited

U.S. PATENT DOCUMENTS

| | | | |
|---|---|---|---|
| 4,306,286 | 12/1981 | Cocke et al. | 395/500 |
| 4,583,169 | 4/1986 | Cooledge | 364/191 |
| 4,697,241 | 9/1987 | Lavi | 210/150 |
| 4,706,216 | 11/1987 | Carter | 365/94 |
| 4,744,084 | 5/1988 | Beck et al. | 395/183.09 |
| 4,758,745 | 7/1988 | Elgamal et al. | 326/16 |
| 4,758,985 | 7/1988 | Carter | 365/94 |
| 4,761,768 | 8/1988 | Turner et al. | 365/185.22 |
| 4,849,928 | 7/1989 | Hauck | 395/500 |

(List continued on next page.)

FOREIGN PATENT DOCUMENTS

| | | |
|---|---|---|
| 014951A2 | 7/1985 | European Pat. Off. . |
| SH058205870 | 5/1982 | Japan . |

OTHER PUBLICATIONS

"A User Programmable Reconfigurable Logic Array," by Carter, et al.; IEEE Custom Integrated Circuits Conference, 1986.

"Benefits of In–Circuit Re–Programmable Logic Devices," by Landry, Electro Conference, 1986.

"Programmable Gate Arrays, Technical Data, XC 4000 Logic Cell Array Family," Product Brochure, XILINX, San Jose, CA.

"In–Circuit Emulation For ASIC–Based Designs," Wynn, VLSI Systems Design, pp. 38–45, Oct., 1986.

"Emulation of VLSI Devices Using LCAs," Schmitz, VLSI Systems Design, pp. 54–62, May 20, 1987.

Bradly K. Fawcett, "Taking Advantage of Reconfigurable Logic," (1989) Programmable Logic Guide, pp. 17–24.

Bill Harding, "New Design Tools Revive In–Circuit Design Verification," Computer Design, Feb. 1, 1989, pp. 28,30,32.

Tom Manuel, et al., "Advanced Tools Tackle More Complex Chips In The New Generation of PLDs," Electronics Design & Test, May 12, 1988, pp. 111–113.

(List continued on next page.)

*Primary Examiner*—Zarni Maung
*Attorney, Agent, or Firm*—Lyon & Lyon LLP

[57] ABSTRACT

A memory design is implemented in static memory circuits having a plurality of bidirectional access ports, wherein each port is configured for read or write access. The memory design defines initial contents, depth, width, and bank selection in the memory circuits according to predefined configuration values, as well as, for each access port, whether that access port is configured for read or write. Port access occurs during time slots, which are based on external clock signals and memory circuit access times. Modified memory designs may be implemented such that access ports are accordingly reconfigured.

26 Claims, 4 Drawing Sheets

U.S. PATENT DOCUMENTS

| | | | |
|---|---|---|---|
| 4,862,347 | 8/1989 | Rudy | 395/500 |
| 4,870,302 | 9/1989 | Freeman | 326/41 |
| 4,873,459 | 10/1989 | El Gamal et al. | 326/41 |
| 4,901,259 | 2/1990 | Watkins | 364/578 |
| 4,914,612 | 4/1990 | Beece et al. | 364/578 |
| 4,924,429 | 5/1990 | Kurashita et al. | 364/578 |
| 4,935,734 | 6/1990 | Austin | 340/825.83 |
| 4,937,770 | 6/1990 | Samuels et al. | 364/578 |
| 4,937,827 | 6/1990 | Beck et al. | 395/183.09 |
| 5,036,473 | 7/1991 | Butts et al. | 364/489 |
| 5,109,353 | 4/1992 | Sample et al. | 364/578 |
| 5,129,069 | 7/1992 | Helm et al. | 711/172 |
| 5,140,687 | 8/1992 | Dye et al. | 395/500 |
| 5,210,701 | 5/1993 | Hana et al. | 364/491 |
| 5,224,055 | 6/1993 | Grundy et al. | 364/488 |
| 5,255,363 | 10/1993 | Seyler | 345/507 |
| 5,425,036 | 6/1995 | Liu et al. | 371/24 |
| 5,448,522 | 9/1995 | Huang | 365/189.04 |
| 5,452,231 | 9/1995 | Butts et al. | 364/489 |
| 5,452,239 | 9/1995 | Dai et al. | 364/578 |
| 5,487,018 | 1/1996 | Loo et al. | 364/489 |
| 5,563,829 | 10/1996 | Huang | 365/189.04 |
| 5,598,344 | 1/1997 | Dangelo et al. | 364/489 |
| 5,603,043 | 2/1997 | Taylor et al. | 395/800 |
| 5,649,167 | 7/1997 | Chen et al. | 395/500 |

OTHER PUBLICATIONS

Bob Milne, "Prototype PC Board Emulates ASICs," Electronic Design, Nov. 23, 1988, pp. 149–151.

Gregory F. Pfister, "The Yorktown Simulation Engine: Introduction," 19th Design Automation Conference, (1982) IEEE, pp. 51–73.

David Shear, "Tools Help You Retain The Advantages of Using Breadboards In Gate–Array Design," Technology Update, EDN, Mar. 18, 1987, pp. 81–88.

Stephen Walters, "Computer–Aided Prototyping for ASIC–Based Systems," IEEE Design & Test of Computers, Jun. 1991, pp. 4–10.

Pardner Wynn, "Designing With Logic Cell Arrays," Electro/87 and Mini/Micro Northeast Conference Record, (1987), pp. 1–9.

Xilinx, Inc., "The Programmable Gate Array Data Book," (1988), pp. 1–2—8–5.

Xilinx, Inc., "The Programmable Gate Array Design Handbook," First Edition, (1986) pp. 1–1—4–33, A–1—A9.

METHOD AND APPARATUS FOR EMULATING MULTI-PORTED MEMORY CIRCUITS

This is a continuation of prior complete application Ser. No. 08/617,977, filed on Mar. 15, 1996, now abandoned, which is a continuation of application Ser. No. 08/310,202, filed Sep. 21, 1994, now abandoned, which is a continuation of application Ser. No. 08/082,051, filed Jun. 24, 1993, now abandoned.

BACKGROUND OF THE INVENTION

1. Field of the Invention

This invention relates to configurable electronic storage devices, particularly to memory cells configured for emulating circuits including digital memory.

2. Description of the Background Art

In the area of electronic design automation (EDA), engineers use various software and associated hardware to define and verify circuit designs. A multi-ported memory design ("memory design") particularly to achieve more accurate verification of circuit designs, "emulators," are employed to construct functional representations of circuit designs. Because such emulated representations allow a circuit designer flexibly to operate or develop a target system coupled to the emulated representation, even before the prototype circuit design or hardware is actually manufactured, overall design time and cost is reduced significantly.

Although conventional emulation tools are suited for defining and verifying logic circuits, such tools are not used easily for emulating memory circuits, particularly multi-ported memory circuits configured in various storage configurations. It would be desirable, therefore, to provide memory circuits which are more easily configurable to emulate prototype circuit designs.

SUMMARY OF THE INVENTION

The invention resides in implementing the physical memory access ports are in at least one of various memory circuits having multiple access ports, wherein each access port is configured for either reading from or writing to the memory circuits.

Preferably, each memory circuit comprises static memory cells having three bidirectional access ports, and the memory design defines initial storage contents, depth, width, and bank selection in the memory circuits according to predefined configuration values. Also the memory design may define, whether the physical memory access ports are configured for reading or writing.

Optionally, the configured access ports may be accessed during predefined time slots to read from or write to the memory circuits. Separate time slots may be predefined for reading from or writing to the memory circuits, as opposed to non-memory logic circuits. Time slots may be predefined as a function of external clock signals and memory circuit access times.

Optionally, a circuit design may be partitioned into a logic circuit design for implementation in a reconfigurable logic module and into the memory circuit design for implementation in at least one of the memory circuits. The reconfigurable logic module may be interconnected directly, or through a programmable interconnect module, to the memory circuits.

To emulate the partitioned circuit design, the reconfigurable logic module and the memory circuits are interconnected and coupled to a target system, which is then operated after so coupled. During emulation, the target system may access the access ports to read from or write to the memory circuits. The target system may also cause a different memory circuit definition to be implemented in the memory circuits, whereupon the access ports would be reconfigured accordingly.

DESCRIPTION OF THE PREFERRED EMBODIMENTS

Figure 1:
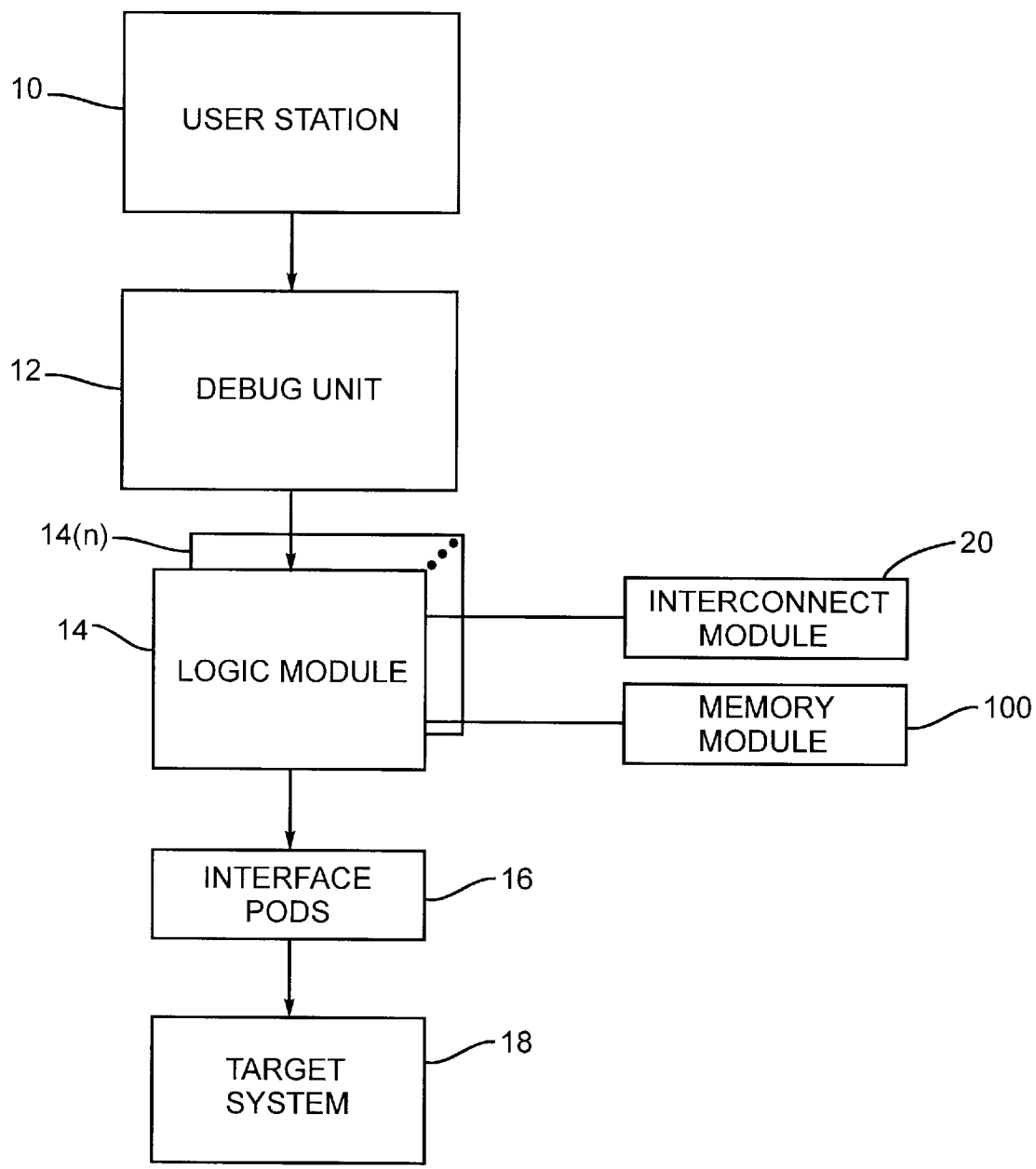
FIG. 1 is a block diagram of an electronic design automation (EDA) system showing user station 10, debug unit 12, and logic modules 14 coupled to interconnect and memory modules 20, 100 and to target system 18 through interface pods 16.

FIG. 1 is a block diagram of an electronic design automation (EDA) system showing engineering workstation or user station 10 coupled to debugger or debug unit 12, logic block modules (LBM) 14, programmable interconnect module (PIM) 20, configurable memory module 100, interface pods 16, and target system 18. The EDA system, which is configured for emulation similarly to the "MARS" logic emulation systems designed by PiE Design Systems, Inc. (Sunnyvale, Calif.), is used by a circuit or system designer to define and verify circuit or system functionality using bread-boarding or emulation techniques. Additional LBMs 14(N) are used to emulate more complex circuits or systems.

User station 10 includes a conventional processor which may couple to a network of similar processors for communication or distributed processing. User station 10 contains computer-aided engineering and design (CAE/CAD) software EDA tools. For example, a circuit designer may use such tools to enter circuit schematics or synthesize logic gates to define circuit or system functionality, and then use such tools to simulate or verify the defined functionality.

The circuit designer may perform additional verification by emulating the defined functionality. Emulation enables the circuit designer to operate an emulated representation of the circuit design in target system 18, in which the circuit design is eventually intended to operate.

Initially, before a circuit design may be emulated, the circuit designer uses the EDA tools to design, and preferably verify, a circuit design. The circuit designer also uses the EDA tools to generate a conventional circuit file, or netlist, which provides a textual listing (i.e., in "ASCII" format) of components and interconnections within the circuit design. In accordance with the present invention, each circuit design is defined to include at least one memory component and at least one logic component.

Debug unit 12, which is coupled to user station 10, allows the circuit designer to transfer or down-load the generated netlist from user station 10 to logic modules 14, interconnect module 20, and memory module 100. Debug unit 12 also serves as a functional tester and logic analyzer for verifying the operation of the emulated representation of the circuit design. Debug unit 12 may operate in either functional test (debug) mode or emulation (run) mode.

After a netlist representing the circuit design is generated, the netlist is implemented physically or "down-loaded" into various reconfigurable logic circuits or field-programmable gate arrays (FPGAs) included in logic modules 14, in the case of logic components, and into memory cells or static random access memory (SRAM) included in memory module 100, in the case of memory components.

Emulation is achieved by programmably configuring, according to the netlist, the actual interconnection and functional implementation of reconfigurable logic circuits included in logic modules 14, and, as necessary, the actual interconnection of reconfigurable electrical paths in interconnect module and the actual memory configuration and contents in memory module 100.

The circuit designer invokes a design-import command to cause the EDA tools to check, among other things, whether all logic and memory components included in the netlist are available or stored in a predefined library or database of logic and memory representations, as provided respectively in logic module 14 and memory module 100. Preferably, if a particular logic or memory component is not available in the library, then the EDA tool may generate a particular configuration of a corresponding generic logic or memory component. In this way, using the EDA tool to generate or construct a particular component configuration, the circuit designer may customize or specify more completely certain functionality or operational parameters of such particular configuration.

After the netlist is imported, the circuit designer may invoke a partitioner program included in the EDA tools to determine which netlist components components are logic and memory components. Preferably, components which include binary or digital information configured or arranged for temporary or permanent storage in conventional or various combinatorial, sequential, or state devices are determined to be memory circuits or components. Examples of memory components include core memory arrays having single or multiple ports, cache arrays (including store, tag and status arrays,) multi-ported register files, microcode read-only memory (ROM), on-chip random-access memory (RAM), first-in/first-out (FIFO), and processor memory (including instruction and data caches, general purpose registers, and local and main storage RAM).

Other components included in the netlist, typically including conventional combinatorial, sequential, or state circuits configured or designed for non-storage applications, are determined to be logic circuits or components. It is possible, as designated by the design engineer, to employ conventional logic circuits for storage memory-type design applications.

After determining which netlist components are logic components and which are memory components, the partitioner program partitions the netlist for down-loading or actual functional implementation of the components and interconnections to logic modules 14, interconnect module 20 or memory module 100.

Logic components are down-loaded to logic modules 14 to configure logic circuit portions and associated interconnections, preferably using conventional techniques for programming or configuring FPGAs or configurable logic blocks (CLBs) contained therein according to the partitioned netlist. Memory components are down-loaded to memory module 100 as described further herein. Optionally, memory components may be down-loaded to logic modules 14 for equivalent functional implementation therein.

Interconnections in the netlist may be down-loaded either to logic module 14, using available configurable interconnect on each logic module 14 or FPGAs contained therein, or to interconnect module 20, using programmable interconnect paths or configurable cross-bar switches available therein.

The entire circuit design is implemented functionally and physically for emulation when all or the desired portions or sub-netlists of logic and memory components and interconnections in the netlist are down-loaded to logic modules 14, memory module 100 and, optionally, interconnect module 20. Upon such configuration, the circuit design implemented in logic modules 14, interconnect module 20, and memory module 100 may be coupled through various interface pods or signal connections 16 to a conventional port or signal socket in target system 18 for actual functional operation or emulation therein.

During emulation, target system 18 operates under normal or close-to-normal conditions or timing, by applying thereto appropriate data, control, test, power, ground and other appropriate signals, vectors or stimuli. In this way, the circuit designer may debug or test the functionality of target system 18 or the prototype design temporarily configured for emulation in logic modules 14, interconnect module 20 and memory module 100.

Additionally, the circuit designer may need to reconfigure the interconnections or netlist components and thus modify the circuit design. The circuit designer can modify the circuit design by using the EDA tools to redefine, and if necessary, reverify, the and generate a netlist of the circuit design. Virtually unlimited number and extent of modifications are possible because the functional implementation of logic circuits and interconnections in logic modules 14, memory circuits in interconnect module 20, and interconnections in memory module 100 are reconfigurable or reprogrammable using the EDA tools.

Figure 2:
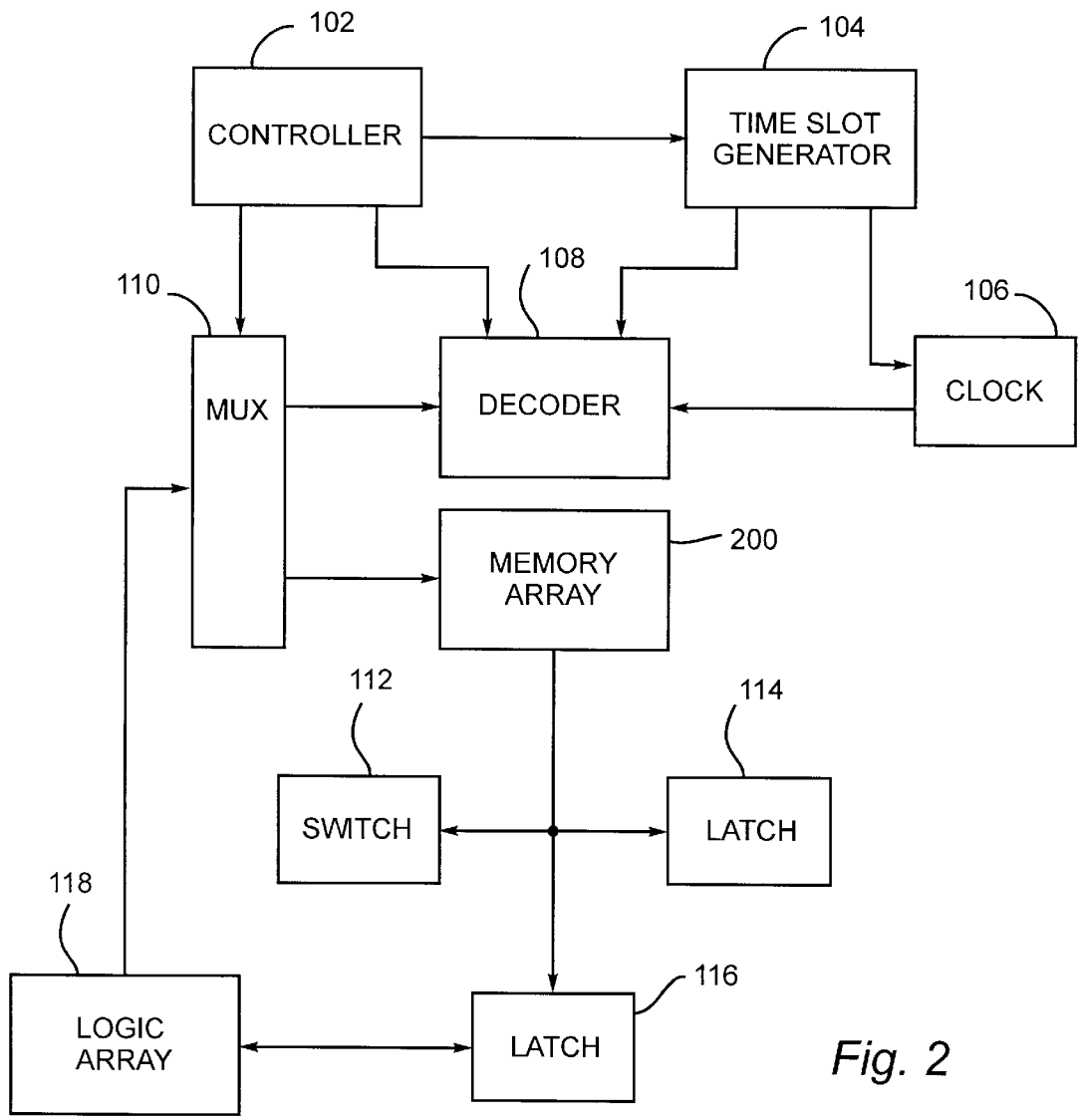
FIG. 2 is a block diagram of memory module 100 showing memory array 200 and related circuitry.

FIG. 2 is a block diagram of memory module 100 showing memory array 200 and related circuitry, including "JTAG" processor or controller 102, time slot or signal generator 104, memory configuration decoder 108, external clock or oscillator 106, multiplexer (MUX) 110, reconfigurable logic or "beta-alpha" array 118, and bidirectional switch or latches 112, 114, 116.

Figure 3:
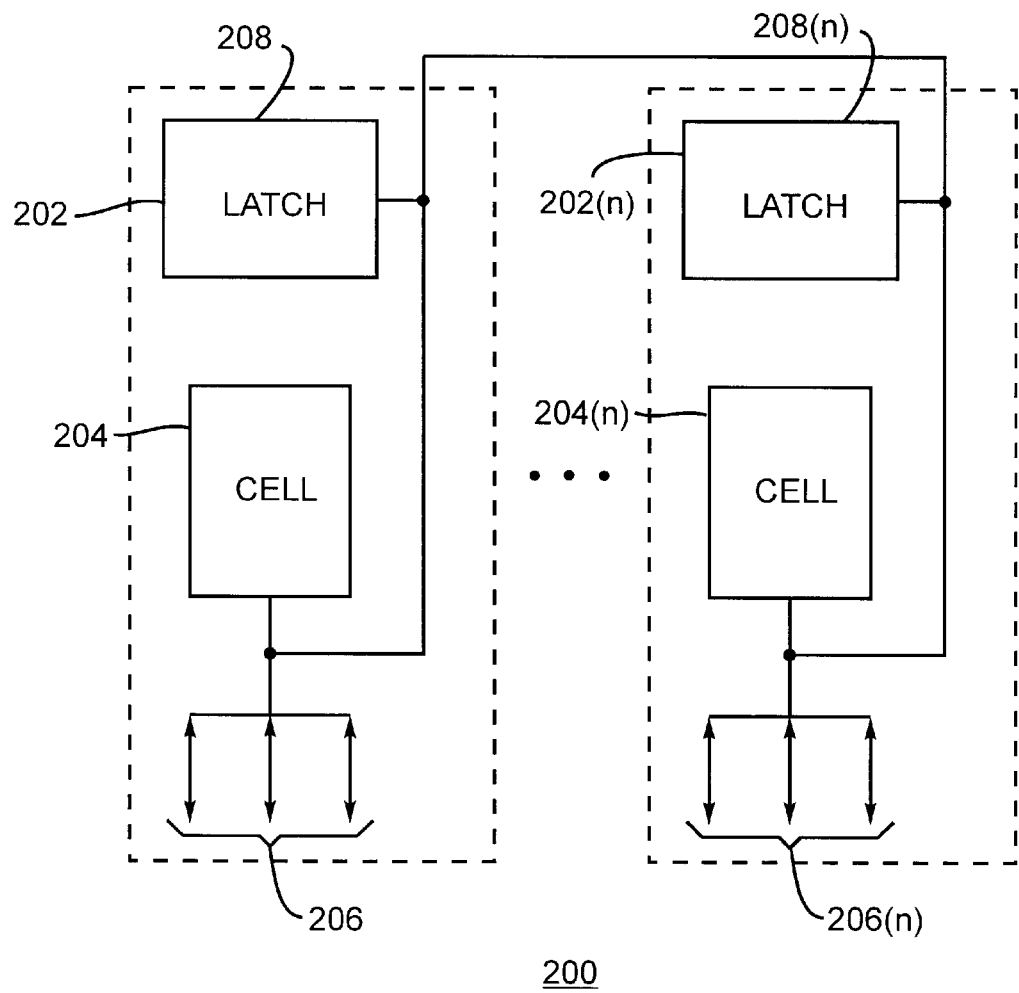
FIG. 3 is a block diagram of memory array 200 showing memory circuit 208 including cells 204 and latches 202.

In FIG. 3, memory array 200 is shown with various interconnected memory circuits 208 including digital storage circuits or cells 204, data latches or switches 202, and configurable, bidirectional read/write ports 206. Preferably, cell 204 includes eight 3-port static random access memory (SRAM), wherein each cell 204 is a 32K×32 SPAM having 25-ns access time. The access direction for each port 206 is configured or programmed as either read mode or write mode for appropriate access to corresponding cell 204, preferably by configuring or programming the signal switching direction of switch 112, latch 114 or latch 116 coupled thereto.

Controller 102 receives partitioned netlist information including logic and memory components, configuration and initialization state information and interconection, representing circuit designs, which are down-loaded by the EDA tools from user station 10 or debug unit 12. Logic component or associated interconnection, configuration, or initialization information are down-loaded to program or configure reconfigurable logic devices or FPGAs included in logic array 118.

Memory component or associated interconnection, configuration, or initialization information are downloaded to program or configure reconfigurable logic devices or FPGAs included in logic array 118, reconfigurable memory cells 204, reconfigurable read/write I/O ports 206 or reconfigurable bidirectional latches 202 in memory array 200, or reconfigurable bidirectional switches 112, latch 114, latch 116 in memory module 100.

Controller 102 also receives, stores and applies test or boundary scan vectors or patterns for verifying circuit functionality throughout memory module 100, preferably in accordance with the JTAG standard, as defined in IEEE Std. 1149.1: "Standard Test Access Port and Boundary Scan Architecture." Controller 102 is a conventional microprocessor coupled to time slot generator 104, MUX 110, and decoder 108 and receives instructions from a host processor, which may be either user station 10 or debug unit 12.

Controller 102 uses a pre-specified instruction set provided in local disk or memory storage for processing the down-loading of partitioned netlist information into configurable memory circuits in memory array 200, preferably in accordance with the provided EDA tools.

Additional instructions are specified therein for configuring memory circuits in memory array 200 according to memory components provided in the netlist, in particular according to pre-defined configurations values such as port 206 access direction, digital storage content, storage depth size, storage width size and storage bank selections.

Decoder 108 is a memory configuration decoder circuit, embodied preferably as a programmable logic array (PLA) having 93 inputs, wherein 8 input pins are used for configuration code, 12 input pins are used for bank and sub-bank select, 24 input pins are used for read/write port select, 16 input pins are used for memory cell grouping, 8 input pins are used for memory cell enable, 24 pins are used for port time slot clock, and one input pin is used for system clock; and 136 outputs, wherein 32 output pins are used for write enable, 8 output pins are used for global bus enable, and 96 output pins are used for latch control.

Time slot generator 104 generates preferably up to 24 time slots or timed signal pulses for 24 ports. Time slots are generated for both data and address each time slot has a 40-ns duration, wherein 10 ns is allocated for address time and 25 ns is allocated for access time. A programmable delay line may be applied before each time slot, and actual delay time depends on address to system clock delay.

Time slot generator 104 operates preferably under the control of controller 102 to provide tap output signals for enabling port read/write select and bank/sub-bank select to generate proper write signal and port data latch control. Additionally, time slot generator 104 adds read data delay time to system cycle time whenever the last or most recently read port is followed by more than 4 ports. Preferably, 150 ns of delay time is thereby added.

Logic array 118, which may be coupled to logic modules 14, includes reconfigurable logic circuits or FPGAs coupled to MUX 110 and switch 112, latch 116, and latch 114. Switch 112, latch 114 and latch 116 are reprogrammable bidirectional digital switches or latches, such as 74F543, which are each coupled to access ports 206 for accessing digital information for reading or writing to cells 204.

As shown in FIG. 2, MUX 110 is coupled to controller 102, decoder 108, memory array 200 and logic array 118; and clock 106 is coupled to time slot generator 104 and decoder 108.

Preferably, memory module 100 is configured with predefined parameters. Memory depth is configured from 1 to 32,767. Bank width is limited to 32, 64, 128 or 256 bits. Thus, if a memory design uses 95 bits in width, then 128 bits are specified. Bank select configuration depends on bank width. For example, a 128-bit bank allows no more than two banks because memory module 100 has a 256-bit width maximum.

Sub-bank select configuration is used for partial write operation. Thus, sub-bank select permits only one byte to be updated for example, 4-byte select is configured for 32-bit widths, 8-byte select is configured for 64-bit widths, 8 double-byte select is configured for 128-bit widths, and 8 quad-byte select is configured for 256-bit width. Sub-bank select may be disabled if partial write capability is not required. Sub-bank select is disabled if the netlist description did not select subbank select capability. Moreover, one to 24 read ports and one to 16 write ports are preferably configured. The total number of read and write ports configured is 24.

Therefore, in accordance with the present invention, a memory design is implemented in at least one of various memory circuits 200, 208 having multiple access ports 206, wherein each access port 206 of each memory circuit 200, 208, in which the memory design is implemented, is configured for either reading from or writing to each such memory circuit 200, 208.

Preferably, each memory circuit 200, 208 comprises static memory cells 204 having three bidirectional access ports 206, and the memory design defines initial storage contents, depth, width, and bank selection in the memory circuits 200, 208 according to predefined configuration values. Representative configuration values are provided in the attached Table I. As shown in Table I, with a 32-bit data word, the maximum number of access ports 206 is twenty-four (24 ports * 32 bits–768 bits). Similarly, a 64-bit data word corresponds to a maximum of twelve access ports 206 (12 ports * 64 bits–768 bits). A 128-bit data word results in the allocation of six access ports 206 while a 256-bit data word corresponds to three access ports 206. Also the memory design may define, for each access port 206 of memory circuits 200, 208 having the implemented memory design, whether such access port 206 is configured for read or write mode.

Such configuration definition for memory access is achieved preferably by programming or configuring each bidirectional switch 112, latch 114, or latch 116, which is coupled to each of three access ports 206. In this way, each port 206 is implemented for write-only access (i.e., inbound signal direction) or read-only access (i.e., outbound signal direction). Each access port 206 may also be configured bidirectionally, for read and write access.

Optionally, the same memory design may be implemented in each of the memory circuits 200, 208, such that, for example, all access ports 206 for each memory circuit 200, 208 are configured identically.

Optionally, the configured access ports 206 may be accessed during predefined time slots provided by time slot generator 104 to read from or write to memory circuits 200, 208. Separate time slots may be predefined (e.g., prior to or during emulation) for reading from or writing to the memory circuits 200, 208, as opposed to non-memory logic circuits.

Time slots may be predefined as a function of external clock signals and memory circuit access times, and specified accordingly by the circuit designer, for example, during netlisting or emulation. During a common or multiplexed time slot, a set of configured access ports 206 may be accessed in parallel; or alternatively, a single memory circuit 200, 208 may be accessed serially during each time slot (i.e., one at a time). Moreover, such accessing may be initiated by an asynchronous read or read-back trigger event.

Preferably, stored digital information is accessed from memory array 200 in words of equal to or smaller than a predefined size. Thus, when accessed words are larger than the predefined size, controller 102 partitions or parses such larger words into word portions which are each smaller than or equal to the predefined size. Additionally, each word portion is accessed preferably during different or subsequent time slots.

Optionally, a circuit design may be partitioned into a logic circuit design for implementation in a reconfigurable logic module 14 and into the memory design for implementation in at least one of the memory circuits 200, 208. The reconfigurable logic module 14 may be interconnected directly, or through a programmable interconnect module 20, to the memory circuits 200, 208.

To emulate the partitioned circuit design the reconfigurable logic module 14 and the memory circuits 200, 208 are interconnected to target system. During emulation, the target system 18 may access the access ports 206 to read from or write to the memory circuits 200, 208. In a redefined configuration, target system 18 may also cause a different memory design to be implemented in the memory circuits 200, 208, whereupon the access ports 206 would be reconfigured accordingly.

Figure 4:
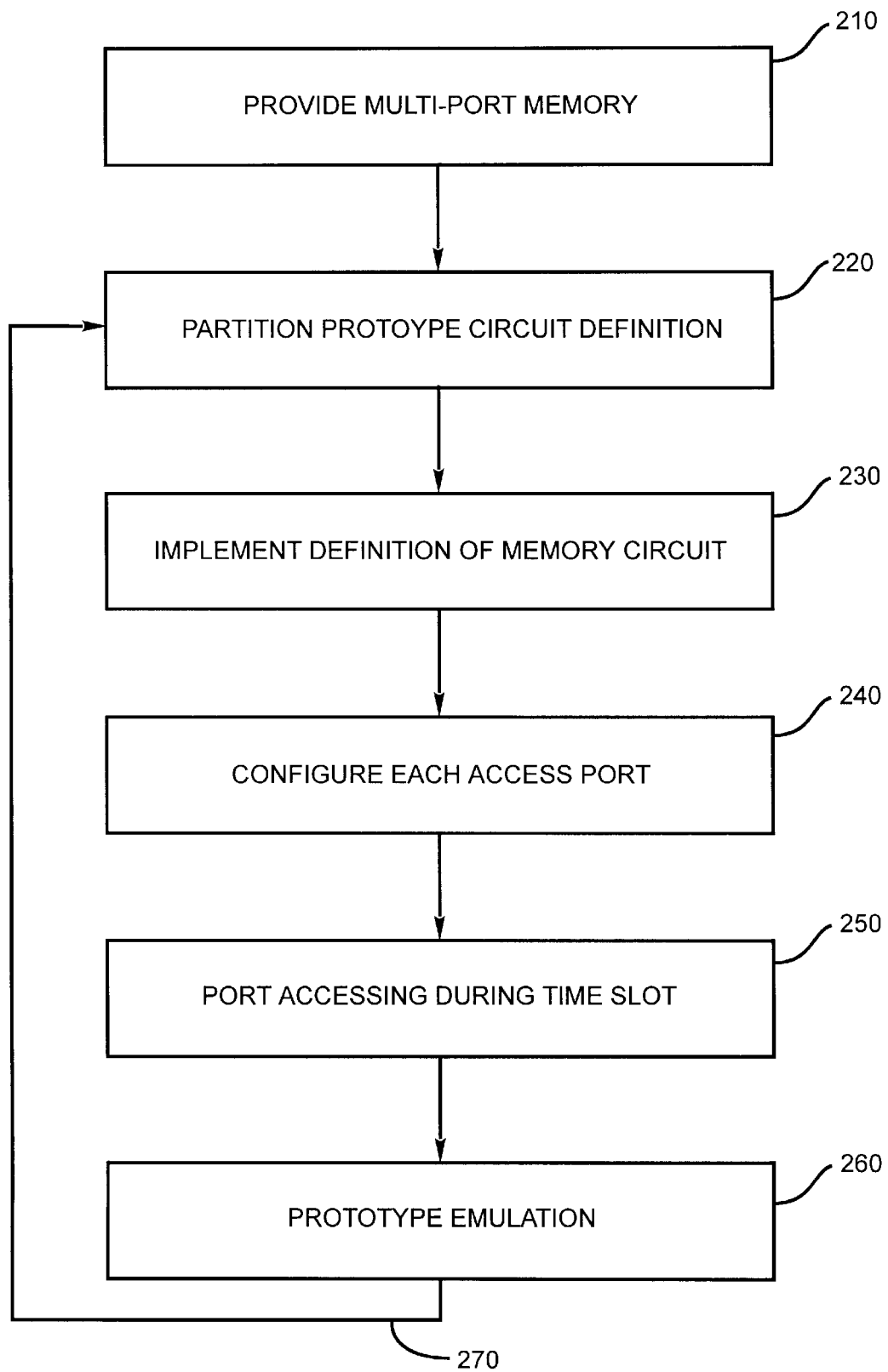
FIG. 4 is a flow chart showing generally a method embodying the present invention.

In FIG. 4, a flow chart illustrates generally a method representative of the present invention. Initially, at least one memory circuit 100, 200, 208 is provided 210, wherein each memory circuit includes at least one static memory cell having preferably three access ports, wherein each port comprises a bidirectional switch. Then, a circuit design, preferably in the form of a netlist, is partitioned 220 into logic and memory portions.

In accordance with the present invention, the memory portion or definition is implemented 230 in at least one of the provided memory circuits, wherein such memory definition preferably defines intial configuration values. In addition, each access port 206 of the memory circuits having the implemented memory definition may be configured 240 for either reading or writing. Preferably during a predefined time slot, at least one of the configured access ports is accessed 250 to read or write from such memory circuits.

In the foregoing arrangement, prototype circuit emulation 260 is thereby enabled, and, as determined accordingly by the circuit designer, prototype circuit definition 220 and subsequent steps 230–260 may be repeated 270.

TABLE I

| CELL: | PORT: | BANK: | SUB-BANK: | WRITE WIDTH: | READ WIDTH |
|---|---|---|---|---|---|
| Configurations for 32-bit data word with 8-bit write select: | | | | | |
| 8 | 16W 8R | 8 | 4*8 | 32 | 32 |
|   | 16W 4R | 8 | 4 | 32 | 64 |
|   | 16W 2R | 8 | 4 | 32 | 128 |
|   | 16W 1R | 8 | 4 | 32 | 256 |
|   | 8W 16R | 8 | 4 | 32 | 32 |
|   | 8W 8R | 8 | 4 | 32 | 64 |
|   | 8W 4R | 8 | 4 | 32 | 128 |
|   | 8W 2R | 8 | 4 | 32 | 256 |
|   | 8W 1R | 8 | 4 | 32 | 256 |
| 4 | 8W 4R | 4 | 4 | 32 | 32 |
|   | 8W 2R | 4 | 4 | 32 | 64 |
|   | 8W 1R | 4 | 4 | 32 | 128 |
|   | 4W 8R | 4 | 4 | 32 | 32 |
|   | 4W 4R | 4 | 4 | 32 | 64 |
|   | 4W 2R | 4 | 4 | 32 | 128 |
|   | 4W 1R | 4 | 4 | 32 | 128 |

TABLE I-continued

| CELL: | PORT: | BANK: | SUB-BANK: | WRITE WIDTH: | READ WIDTH |
|---|---|---|---|---|---|
| 2 | 4W 2R | 2 | 4 | 32 | 32 |
|   | 4W 1R | 2 | 4 | 32 | 64 |
|   | 2W 4R | 2 | 4 | 32 | 32 |
|   | 2W 2R | 2 | 4 | 32 | 64 |
|   | 2W 1R | 2 | 4 | 32 | 64 |
| 1 | 2W 1R | 1 | 4 | 32 | 32 |
|   | 1W 2R | 1 | 4 | 32 | 32 |
|   | 1W 1R | 1 | 4 | 32 | 32 |
| Configurations for 64-bit data word with 8-bit write select: | | | | | |
| 8 | 8W 4R | 4 | 8*8 | 64 | 64 |
|   | 8W 2R | 4 | 8 | 64 | 128 |
|   | 8W 1R | 4 | 8 | 64 | 256 |
|   | 4W 8R | 4 | 8 | 64 | 64 |
|   | 4W 4W | 4 | 8 | 64 | 128 |
|   | 4W 2R | 4 | 8 | 64 | 256 |
|   | 4W 1R | 4 | 8 | 64 | 256 |
|   | 2W 8R | 4 | 8 | 64 | 64 |
|   | 2W 4R | 4 | 8 | 64 | 128 |
|   | 2W 2R | 4 | 8 | 64 | 256 |
|   | 2W 1R | 4 | 8 | 64 | 256 |
| 4 | 4W 2R | 2 | 8 | 64 | 64 |
|   | 4W 1R | 2 | 8 | 64 | 64 |
|   | 2W 4R | 2 | 8 | 64 | 64 |
|   | 2W 2R | 2 | 8 | 64 | 128 |
|   | 2W 1R | 2 | 8 | 64 | 128 |
| 2 | 2W 1R | 1 | 8 | 64 | 64 |
|   | 1W 2R | 1 | 8 | 64 | 64 |
|   | 1W 1R | 1 | 8 | 64 | 64 |
| Configurations for 128-bit data word with 16-bit write select: | | | | | |
| 8 | 4W 2R | 2 | 8*16 | 128 | 128 |
|   | 4W 1R | 2 | 8 | 128 | 128 |
|   | 2W 4R | 2 | 8 | 128 | 128 |
|   | 2W 2R | 2 | 8 | 128 | 256 |
|   | 2W 1R | 2 | 8 | 128 | 256 |
| 4 | 2W 1R | 1 | 8 | 128 | 128 |
|   | 1W 2R | 1 | 8 | 128 | 128 |
|   | 1W 1R | 1 | 8 | 128 | 128 |
| Configurations for 256-bit data word with 32-bit write select: | | | | | |
| 8 | 2W 1R | 1 | 8*32 | 256 | 256 |
|   | 1W 2R | 1 | 8 | 256 | 256 |
|   | 1W 1R | 1 | 8 | 256 | 256 |

I claim:

1. A metdod for emulating a circuit design, said circuit design including a multi-ported memory design, said multi-ported memory design comprising a plurality of access ports, said plurality of access ports allowing data to be written into memory cells of said multi-ported memory design, said plurality of access ports further allowing data to be read from memory cells of said memory circuit said method comprising:

generating a netlist description representative of said circuit design;

realizing said netlist description into at least one reconfigurable logic circuit and at least one memory circuit, said at least one memory circuit comprising an integrated circuit having memory elements therein;

configuring said access ports, for reading data signals from and writing data signals to said at least one memory circuit to represent said netlist description; and allocating a plurality of time slots for reading data from and writing data to said at least one memory circuit so that said memory elements of said at least one memory circuit can contain different data signals for each of said time slots.

2. The method of claim 1 wherein:

at least one of said memory cells comprises at least one static memory cell.

3. The method of claim 1 wherein:
at least one access port comprises a bidirectional switch configured to represent the circuit design.

4. The method of claim 1 wherein:
said netlist description defines whether said access ports are configured for reading from and writing to said memory circuits.

5. The method of claim 1 wherein:
a portion of said netlist description is repeatedly realized in each of said at least one memory circuit.

6. The method of claim 1 further comprising the step of:
partitioning said netlist description into a logic circuit design for implementation in at least one of said reconfigurable logic circuits and into said multi-ported memory design for implementation in at least one of said at least one memory circuit.

7. The method of claim 1 wherein:
at least one of said reconfigurable logic circuits is interconnected to at least one of said at least one memory circuit through a programmable interconnect module.

8. The method of claim 1 further comprising the steps of:
generating a modified netlist representation of a modified circuit design;
implementing said modified netlist representation in at least one of said at least one memory circuit; and
reconfiguring said access ports of said multi-port memory circuits for reading from and writing to said multi-port memory circuits.

9. The method of claim 1 wherein:
said netlist representation comprises at least one initial storage content and said method comprises the step of configuring said at least one memory circuit to represent said storage content.

10. The method of claim 1 wherein:
said netlist description comprises at least one storage depth value and at least one storage width value, and said method comprises the step of configuring said at least one memory circuit to represent said storage depth value and said storage width value.

11. The method of claim 1 wherein:
said netlist description comprises at least one storage bank selection, and said method comprises the step of configuring said at least one memory circuit to represent said storage bank selection.

12. The method of claim 1 wherein said step of generating a plurality of time slots further comprises the steps of:
providing a signal generator;
said signal generator generating said plurality of time slots;
allocating said time slots for reading from and writing to said at least one memory circuit;
accessing at least one access port at said time slot; and
providing interactive user control of said time slots.

13. The method of claim 12 wherein:
said signal generator generates said time slot measured by an access time of said memory circuits.

14. The method of claim 12 wherein:
said signal generator generates said time slot measured by an external clock signal.

15. The method of claim 12 further comprising the steps of:
comparing said words of predefined size to a plurality of accessed words;
partitioning said accessed words larger than said words of predefined size into a plurality of word portions which are each no larger than said words of predefined size; and
accessing each word portion during separate time slots.

16. The method of claim 1 wherein:
said access ports are accessed in parallel at a common time slot.

17. The method of claim 1 wherein:
a single one of said at least one memory circuit is accessed during each time slot.

18. The method of claim 1 wherein:
accessing said access ports to read from or write to said at least one memory circuit is initiated by an asynchronous read event.

19. The method of claim 1 wherein:
accessing said access ports to read from or write to said at least one memory circuit is initiated by a read-back trigger event.

20. The method of claim 1 wherein: a plurality of words having a predefined size are accessed from each access port.

21. The method of claim 1 further comprising the steps of:
connecting at least one of said reconfigurable logic circuits and at least one of said at least one memory circuit to a target system;
applying a plurality of signals from said target system to said reconfigurable logic circuits and at least one of said at least one memory circuit; and
at least one of said plurality of signals accessing at least one of said access ports to read from and write to said at least one memory circuit.

22. The method of claim 1 wherein said at least one memory circuit comprises a single-port random access memory integrated circuit.

23. An apparatus for emulating a circuit design the circuit design including a multi-port memory circuit said apparatus comprising a plurality of reconfigurable logic circuits and at least one memory circuit, said multi-port memory circuit comprising a plurality of access ports, said plurality of access ports allowing data to be written into memory cells of said multi-port memory circuit, said plurality of access ports further allowing data to be read from memory cells of said multi-port memory circuit, said apparatus comprising:
a generator capable of processing said circuit design into a netlist description;
a partitioner capable of separating said netlist description into at least one of said plurality of reconfigurable logic circuits and said at least one memory circuit;
means for downloading said netlist description into at least one of said reconfigurable logic circuits and said at least one memory circuit;
means for configuring said plurality of access ports of said multi-port memory circuit for reading data from and writing data to said multi-port memory circuit;
a signal generator capable of generating a plurality of time slots;
means for allocating said time slots for reading data from and writing data to said at least one memory circuit so that said memory cells of said at least one memory circuit can contain different data signals for each of said time slots; and
means for connecting said plurality of reconfigurable logic circuits and said at least one memory circuit to a target system.

24. The apparatus of claim 23 wherein said at least one memory circuit comprises a single-port random access memory circuit.

25. A method for configuring a plurality of memory circuits disposed in a hardware logic emulation system such that said plurality of memory circuits implement a multi-port memory circuit, the method comprising:

providing a netlist description of a plurality of multi-port memory circuits, each multi-port memory circuit having a plurality of access ports, said plurality of access ports allowing data to be written into memory cells of said multi-port memory circuits, said plurality of access ports further allowing data to be read from memory cells of said multi-port memory circuits;

partitioning a circuit design into a logic circuit design for implementation in a reconfigurable logic circuit and into a memory circuit for implementing at least one of said multi-port memory circuits;

configuring said access ports of said memory circuit for reading data from and writing data to said multi-port memory circuits;

accessing during a predefined time slot at least one of said configured access ports to read data from and write data to said memory circuit; and emulating said partitioned circuit design by connecting said reconfigurable logic circuit and said memory circuit to a target system and operating said target system.

26. The apparatus of claim 25 wherein said memory circuit comprises a single-port random access memory circuit.

* * * * *